(12) United States Patent
Varnica et al.

(10) Patent No.: US 8,667,361 B1
(45) Date of Patent: Mar. 4, 2014

(54) SYSTEMS AND METHODS FOR PERFORMING BIT FLIPPING IN AN LDPC DECODER

(75) Inventors: Nedeljko Varnica, San Jose, CA (US); Shashi Kiran Chilappagari, San Jose, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 144 days.

(21) Appl. No.: 13/276,525

(22) Filed: Oct. 19, 2011

Related U.S. Application Data

(60) Provisional application No. 61/405,310, filed on Oct. 21, 2010.

(51) Int. Cl.
*H03M 13/00* (2006.01)

(52) U.S. Cl.
USPC ............... 714/752; 714/755; 714/758

(58) Field of Classification Search
USPC .......................................... 714/752, 755, 758
See application file for complete search history.

(56) References Cited

U.S. PATENT DOCUMENTS

2010/0269011 A1* 10/2010 Oh et al. ................. 714/752

* cited by examiner

*Primary Examiner* — Sam Rizk

(57) ABSTRACT

Systems and methods are provided for decoding data using hard decisions and erasures. Circuitry receives data from each of a plurality of variable nodes which correspond to bits of data being decoded. Each variable node stores one of at least three values. The circuitry determines processes the values received from the plurality of variable nodes according to a set of processing rules. The processing rules are used to determine a condition related to the values stored by the plurality of variable nodes. The circuitry stores an indication of the stored condition at a check node.

20 Claims, 7 Drawing Sheets

Threshold to assign = 2
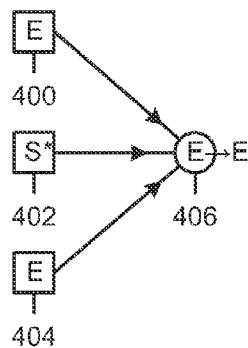
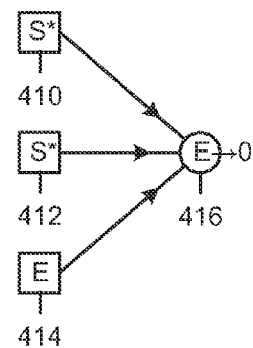
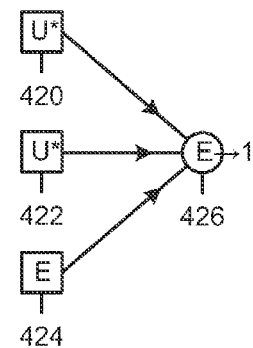
Figure 4A  Figure 4B  Figure 4C
Threshold to toggle = 2
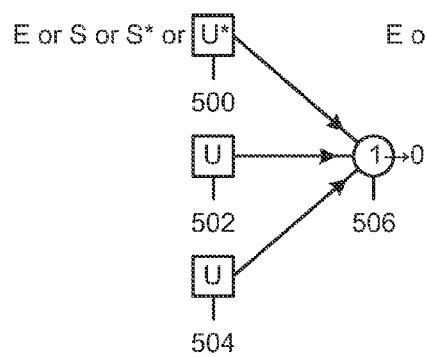
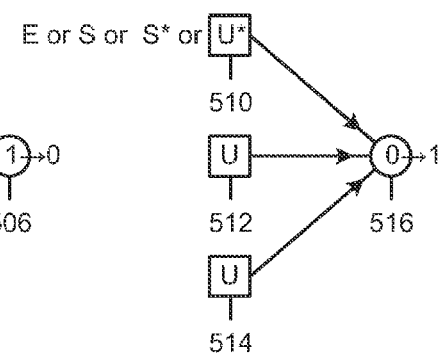
Figure 5A  Figure 5B

SYSTEMS AND METHODS FOR PERFORMING BIT FLIPPING IN AN LDPC DECODER

CROSS REFERENCE TO RELATED APPLICATION

This application claims the benefit under 35 U.S.C. §119(e) of U.S. Provisional Application No. 61/405,310, filed Oct. 21, 2010, which is hereby incorporated by reference herein in its entirety.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

The present disclosure relates generally to data decoding, and more particularly to hard decision and erasure decoders for data encoded with a low density parity check (LDPC) encoder.

LDPC codes and decoders that are used to decode LDPC codes may be used in numerous applications and devices. For example, data storage, satellite communications, wireless communications, wire-line communications, and power-line communications are applications that may each use LDPC codes and LDPC decoders. Devices such as digital camera flash memory storage, satellites, mobile phones, and other mobile devices may also each use LDPC codes and LDPC decoders.

LDPC codes may be used for correcting errors in information transmitted in a noisy communications or data storage channel. The information may be encoded (by a LDPC encoder) prior to transmission and then subsequently decoded (by a LDPC decoder) when received. The performance capability of an LDPC coding scheme is often described by the code's performance curve. The performance curve is a plot of signal-to-noise ratios (SNRs) vs. Bit Error Rate (BER), or equivalently Sector Error Rate (SER). LDPC codes are one of the best performing error correcting codes, along with Turbo codes, for use in correcting errors in information transmitted on communication and data storage channels.

Previous LDPC hard decision algorithms are typically two-state systems, in which bits in an incoming code are assigned to one of two binary states. Improved decoding results can be achieved using soft information, such as probability distributions. However, storing and processing soft information can be very demanding on processor and memory resources.

SUMMARY

The present disclosure relates to a method for decoding data using hard decisions and erasures. In some arrangements, circuitry receives data from each of a plurality of variable nodes which correspond to bits of data being decoded. Each variable node stores one of at least three values. The circuitry determines processes the values received from the plurality of variable nodes according to a set of processing rules. The processing rules are used to determine a condition related to the values stored by the plurality of variable nodes. The circuitry stores an indication of the stored condition at a check node.

In some implementations, the data received from each of the plurality of variable nodes indicates whether a respective one of the variable nodes stores a value indicative of an erased state.

In some implementations, the stored indications of the determined conditions of the check nodes are combined in one or more blocks of memory, so that the number of check nodes is greater than the number of blocks of memory. In some implementations the values of the plurality of variables nodes are combined in one or more blocks of memory, so that the number of variable nodes is greater than the number of blocks of memory.

BRIEF DESCRIPTION OF THE DRAWINGS

The above and other features of the present disclosure, including its nature and its various advantages, will be more apparent upon consideration of the following detailed description, taken in conjunction with the accompanying drawings in which:

FIG. 1A shows an illustrative communications system employing hard decision and erasure decoding in accordance with some arrangements;

FIGS. 4A through 4C show graphical illustrations of processing rules for determining a value of a variable node based on indications of conditions received from check nodes, in accordance with some arrangements;

FIGS. 5A and 5B show graphical illustrations of processing rules for toggling the value of a variable node based on indications of conditions received from check nodes, in accordance with some arrangements;

DETAILED DESCRIPTION

Figure 1B:
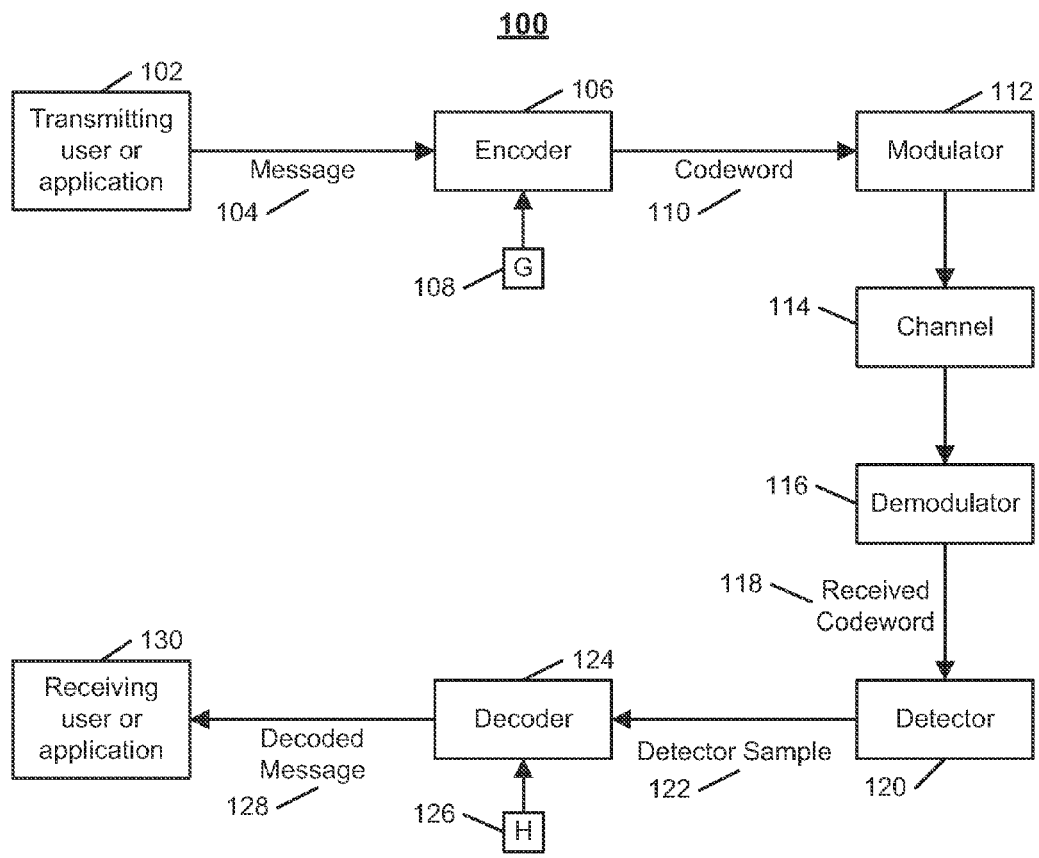
FIG. 1B shows an illustration of processing rules for assigning hard decisions and erasures at the detector of FIG. 1A in accordance with some arrangements.

FIG. 1A shows an illustrative communications system employing hard decision and erasure decoding in accordance with some arrangements. A communications system 100 is used to transmit information from a transmitting user or application 102 to a receiving user or application 130. The transmitting user or application 102 represents an object or entity that produces information. For example, the transmitting user or application 102 may correspond to a software program in a computer system or to a component of a wireless communications transmitter in a radio system. The transmitting user or application 102 produces information in the form of a data stream, and the data stream may be represented by a sequence of symbol values that have been pre-processed by, for example, a source encoder (not shown in FIG. 1A). The information produced by the transmitting user or application 102 may correspond to voice information, video information, financial information, or any other type of information that may be represented in digital or analog form, and the data stream produced by transmitting user or application 102 may be a digital data stream.

The transmitting user or application 102 may segment or otherwise divide the data stream into blocks of a fixed length of k symbols. In particular, a message 104, also referred to as m, represents one of these blocks. In particular, the message $\overline{104}$ is k symbols in length, where each symbol may be binary data, ternary data, quaternary data, any other suitable type of data, or any suitable combination thereof. An encoder 106 is used to encode the message 104 to produce a codeword 110. In a preferred arrangement, the encoder 106 is an LDPC encoder. However, based on the disclosure and teachings provided herein, it should be clear that the encoder 106 may be any other suitable encoder. The codeword 110, also referred to as c, has a length of n symbols, where n>k. The encoder 106 uses a generator matrix G 108, also referred to as G for notational convenience, to produce the codeword 110. For example, the encoder 106 may perform one or more matrix operations to convert the message 104 into the codeword 110. In an arrangement, the encoder 106 produces the codeword 110 from the message 104 using the generator matrix G 108 by the following matrix multiplication $$\underline{c} = G\underline{m}.$$

The codeword 110 may be modulated or otherwise transformed by a modulator 112 into a waveform suitable for transmission and/or storage on a channel 114. For example, the waveform may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

The channel 114 refers to the physical medium through which the transmitted waveform passes or is stored on before being recovered at a demodulator 116. For example, the channel 114 may be a storage channel that represents a storage medium in a computer system environment or a communications channel that represents the wireless propagation environment in a wireless communications environment. Various characteristics of the channel 114 may corrupt data that is communicated or stored thereon. For example, the channel 114 may be a non-ideal memoryless channel or a channel with memory. The output of the channel 114 is demodulated and processed by the demodulator 116 to produce a received codeword 118. The demodulator 116 may use frequency filters, multiplication and integration by periodic functions, and/or any other suitable demodulation technique to demodulate and/or process the output of the channel 114.

The received codeword 118 contains information related to the codeword 110 and may be a corrupted or otherwise altered version of the codeword 110 originally output by the encoder 106. For example, the received codeword 118 may contain a preliminary estimate or noisy version of the codeword 110, a probability distribution vector of possible values of the codeword produced by the encoder 106, or combinations of these as well as other values.

A detector 120 is used to process the received codewords 118 to produce a detector sample 122, which is an estimate of the original data message 104. The detector 120 samples each symbol in the received codeword 118 and assigns each symbol to a bin based on its value. In some arrangements, the bin is assigned based on a probability distribution. Each symbol sampled by the detector 120 is assigned to one of three or more possible bins, or states. Rules for assigning the symbols into one of three bins or states (0, 1, and erasure states) are described in relation to FIG. 1B.

A decoder 124 receives and iteratively processes the detector sample 122. The detector 120 and the decoder 124 may be two separate processors, or a single processor may be used as both the detector 120 and decoder 124. In general, the decoder 124 comprises control circuitry used to iteratively correct and/or detect errors present in the detector sample 122, for example, due to transmission through the channel 114. In an arrangement, the decoder 124 uses the parity check matrix H 126 and a decoding algorithm to produce a decoded message 128. In general, LDPC decoding can be described using a mathematical vector model $H\underline{c}=\vec{0}$, in which c is a binary string of length n and H is the parity check matrix H 126, which is a low-density, sparse n×k matrix, wherein, as above, n is the number of symbols in the codeword and k is the number of symbols in the message. The model is satisfied only when the binary string c is the codeword c 110. The parity check matrix H 126 is not necessarily unique, and may be chosen to be computationally convenient and/or to decrease the number of errors generated by the decoding algorithm of the decoder 124.

The iterative decoding algorithm used by the decoder 124 involves processing a detector sample 122 in which each symbol is assigned as one of three or more input states (e.g., two binary states plus an erasure state). After processing, each symbol in the decoded message 128 is assigned as one of two binary states. When input into the model $H\underline{c}=\vec{0}$ as c, the decoded message 128 satisfies the model. Suitable algorithms for performing the decoding are described in relation to FIGS. 2A through FIG. 7.

The decoded message 128 is delivered to the receiving user or application 130 after being processed by the decoder 124. The receiving user or application 130 may correspond to the same device or entity as the transmitting user or application 102, or the receiving user or application 130 may correspond to a different device or entity. Further, the receiving user or application 130 may be either co-located or physically separated from the transmitting user or application 102.

If the decoder 124 corrects all errors that are induced by the channel 114 and other communications effects in the communications system 100, then the decoded message 126 is a logical replica of the message 104. Otherwise, the decoded message 126 may differ from the message 104, and the decoder 124 may declare an error accordingly.

FIG. 1B shows an illustration of processing rules for assigning hard decisions and erasures at the detector of FIG. 1A in accordance with some arrangements. The detector 120 accesses each symbol of the received codeword 118 stored in memory in order to determine and/or store an input state of each symbol. In FIG. 1B, three input states are shown: 1, E (e.g., "erased"), and 0. These states correspond to the three bins shown in FIG. 1B. To determine to which bin the symbol should be assigned, the actual received value is compared to two thresholds T1 and T2. These thresholds may be predetermined.

As an example, to determine the input state of a given symbol stored in a Flash memory storage device, the memory cell in which the received value of the symbol is stored may be read once or twice. First, the decoder 124 reads the memory cell and compares the charge stored in that cell to a first threshold $T_1$. If the stored charge is less than $T_1$, the stored charge of the symbol falls into the leftmost region 150 and the detector 120 stores a value of 1 as the input state of that symbol. If the charge is greater than $T_1$, the detector 120 reads the memory cell a second time and compares the stored charge to a second threshold $T_2$. If the stored charge is greater than $T_2$, the stored charge of the symbol falls into the rightmost region 154 and the detector 120 stores a value of 0 as the input state of that symbol. Otherwise, it is determined that the stored charge is between $T_1$ and $T_2$; the symbol then falls into the middle region 152 and the detector 120 stores the input state of that symbol as "erased" or E. The input states determined for the detector sample 122 are stored in memory as variable nodes of the sampled codeword. This memory is termed the "hard decision memory", which may be in a different memory location from the received codeword 118.

In some arrangements, each symbol is assigned to one of more than three states. For example, there may be one or more thresholds between $T_1$ and $T_2$, and the erased state may be separated into "high erase" and "low erase" states; "high erase", "middle erase", and "low erase" states; and so forth. It is the goal of the decoder 124 to assign binary values (0 or 1) to symbols initially assigned to an erase state. In general, if the thresholds cause too many symbols to be erased, the algorithm may not be able to efficiently or accurately assign values to all of the erased symbols. On the other hand, if too few symbols are erased, the original assignments of the symbols may be too error prone and hinder the decoder 124. Thus, the two or more thresholds may be optimized based on the received codeword 118.

Figure 2A:
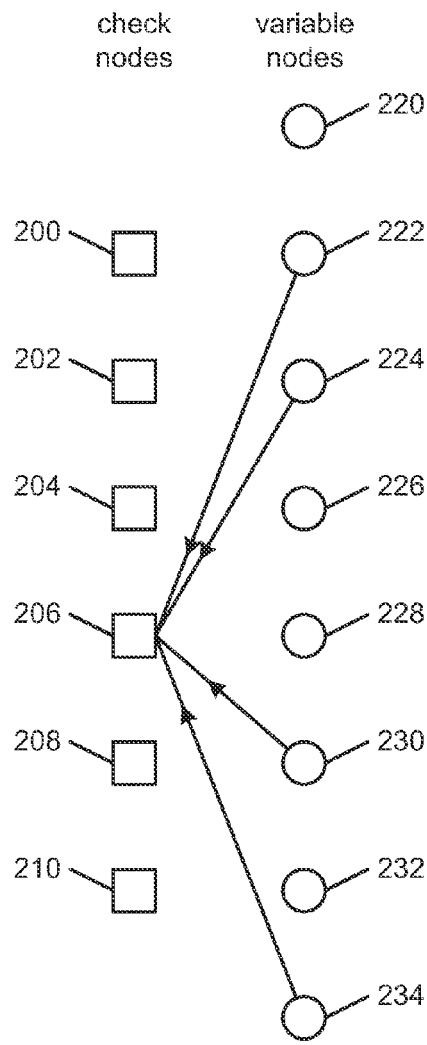
FIGS. 2A and 2B show a graphical illustration of communications between variable nodes representing a codeword and check nodes for decoding the codeword in accordance with some arrangements.
Figure 2B:
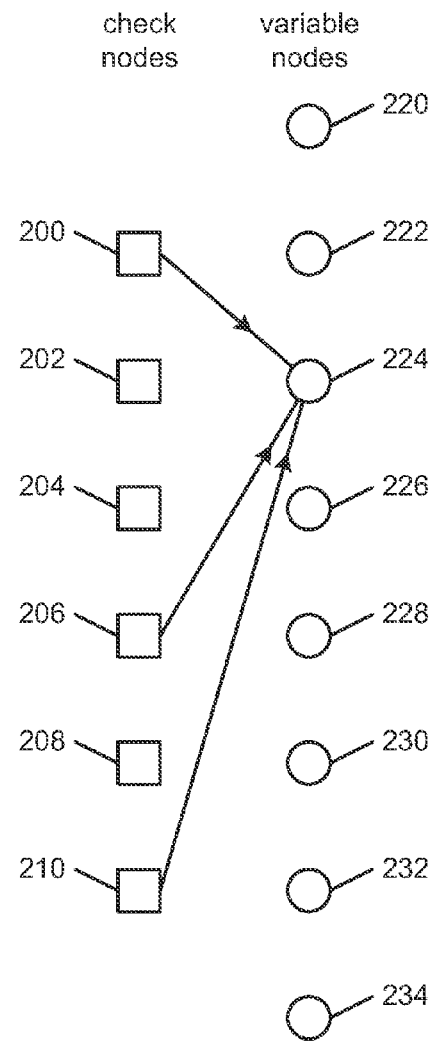

FIGS. 2A and 2B show a graphical illustration of communications between variable nodes 220-234 representing a sampled codeword and check nodes 200-210 for decoding the codeword in accordance with some arrangements.

Figure 1B:
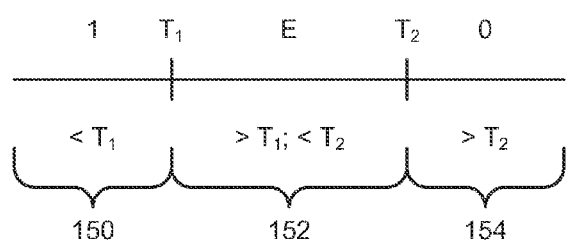

After the variable nodes 220-234 are assigned input states or values using the detector 120 as described above in relation to FIG. 1B, a check of the variable nodes is performed by the detector 124 on a plurality of groups of variable nodes. The detector 124 uses processing rules of a check algorithm to determine a condition of a group of variable nodes. An indication of the determined condition is stored in syndrome memory at a check node, such as check nodes 200-210. The parity check matrix H 126 (FIG. 1) identifies which check nodes store indications of the determined conditions for which variable nodes. For example, for the nodes pictured in FIGS. 2A and 2B, the parity check matrix H 126 may be as follows:

$$H = \begin{bmatrix} 1 & 0 & 1 & 0 & 1 & 1 & 0 & 0 \\ 0 & 1 & 0 & 1 & 0 & 1 & 1 & 0 \\ 1 & 0 & 0 & 1 & 1 & 0 & 1 & 0 \\ 0 & 1 & 1 & 0 & 0 & 1 & 0 & 1 \\ 0 & 1 & 0 & 0 & 1 & 0 & 1 & 1 \\ 1 & 0 & 1 & 1 & 0 & 0 & 0 & 1 \end{bmatrix}$$

Each row corresponds to one of the check nodes, and each column corresponds to one of the variable nodes. The decoder 124 references the parity check matrix H 126 to identify which variable nodes should be checked by a particular check node. For example, for the variable node 206, the decoder 124 determines that variable node 206 (represented by the fourth row) stores the result of a check of variable nodes 222, 224, 230, and 234 (i.e., the second, third, sixth, and eighth variable nodes). Then, the decoder 124 retrieves the values stored in these variable nodes. For illustration, the arrows in FIG. 2A indicate that the retrieved values flow from the variable nodes 222, 224, 230, and 234 to the check node 206, and the check node 206 may be considered to "check" the variable nodes 222, 224, 230, and 234. In reality, the variable node values are retrieved by the decoder 124, which processes the values on behalf of the check node 206 according to the processing rules. From the values received from the variable nodes 222, 224, 230, and 234, the decoder 124 determines whether a given condition for the check node 206 is satisfied or is unsatisfied. In some cases, as will be discussed in reference to FIG. 3A, the processor receives too many values of "erased" from the variable nodes and does not identify whether or not the condition of the check node 206 is satisfied. An indication of whether the check node 206 is satisfied, unsatisfied, or undetermined (i.e., the "syndrome value" of the check node) is stored in syndrome memory, which stores syndrome values or indications of the check nodes. Particular processing rules for determining the conditions of the check nodes are discussed in relation to FIGS. 3A through 3F.

After the indications or syndrome values for the check nodes 200-210 have been stored in the syndrome memory, the values of the variable nodes 220-234 are updated based on the values of the check nodes. The parity check matrix H 126 is again used by the decoder 124 to determine which check nodes should be accessed for a particular variable node. As illustrated in FIG. 2B, for updating the variable node 224, the parity check matrix H 126 given above indicates that check nodes 200, 206, and 210 (i.e., the first, fourth, and sixth variable nodes) should be referenced. Based on the indications of the referenced check nodes, the state of the variable node 224 (e.g., 0, 1, or E) may be updated. Processing rules for determining updated values of variable nodes are discussed in detail in relation to FIGS. 4A through 5B.

Since the value of each variable node is assigned to one of three or more states, two or more bits are used to store each assigned state. For example, three-state input typically requires two-bit storage. However, since two bits can store up to four states, storing the value of each variable node in two dedicated bits is not memory efficient. The storage can be reduced using a memory-combine approach wherein multiple hard decision memory cells for storing variable nodes are combined into blocks. In general, the assigned states of $G_v$ variable nodes each having N possible states can be described by a minimum of $N^{G_v}$ different values. For example, if the values of three variable nodes each assigned to one of three states are stored together in a single block, the values of the variable nodes in the block can be described by one of $3^3=27$ values. The number of bits needed to store 27 different values, then, is $\log_2(27)=4.755>5$. The efficiency in this case is 5 bits÷3 variable nodes=1.6667 bits/node. This is superior to the 2 bits/node that would be required without memory combining.

For greater efficiency in the three-state example, if the block size is five nodes rather than three nodes, the values of the variable nodes in the block can be described by one of $5^3=243$ values. The number of bits needed to store 243 different values is $\log_2(243)=7.928<8$. The efficiency in this case is 8 bits÷5 variable nodes=1.6 bits/node.

Similarly, check nodes stored in syndrome memory can be combined. In various arrangements, the check nodes can be one of three states, four states, five states, or other number of states. If the number of possible states is not a power of two, for memory efficiency, the check nodes can be grouped into blocks and combined, as described above.

Figure 3A:
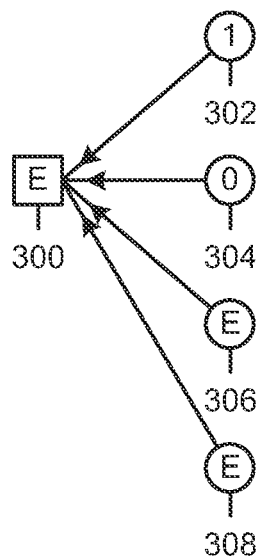
FIG. 3A shows a graphical illustration of a processing rule for determining an condition of a check node based on messages received from variable nodes, in accordance with some arrangements.

FIG. 3A and FIGS. 3C through 3F show graphical illustrations of processing rules for determining conditions of check results to be stored as indications in check nodes based on messages received from variable nodes, in accordance with some arrangements. In FIG. 3A, the decoder 124 is determining the condition of a check node 300. The decoder 124 (acting on behalf of the check node 300) receives values 1, 0, E ("erased"), and E from variable nodes 302, 304, 306, and 308, respectively. In this case, the decoder 124 determines that, having received two binary values and two "erased" values, it does not have enough information to determine whether a particular test for the check node 300 is satisfied or unsatisfied. The check node 300 is assigned an indication of "E" (for "Erasures"), as shown in FIG. 3A, which indicates the condition that at least a threshold number of the variable nodes that the check node 300 receives values from are set to "erased". In this case, the threshold number of erased variable nodes that trigger an indication of "E" is two. However, the threshold number of erased variable nodes that trigger an indication of "E" can be different, and can vary from iteration to iteration.

Figure 3B:
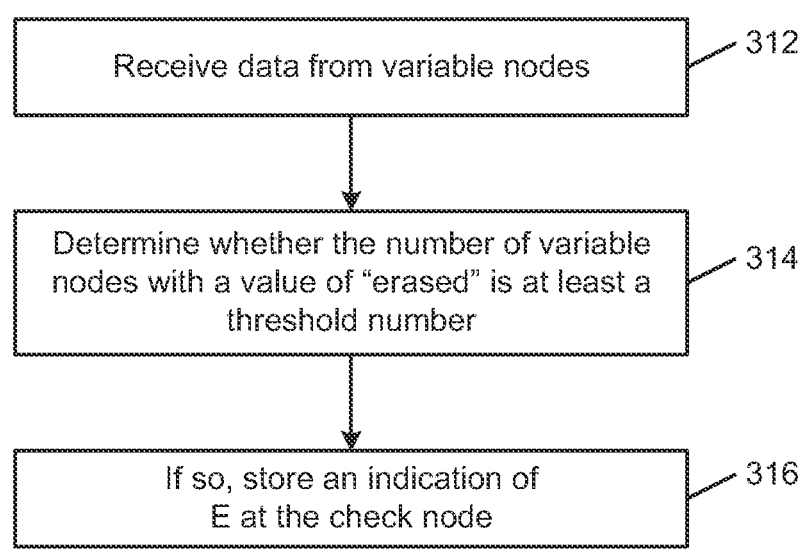
FIG. 3B shows a flow chart for a method of applying the processing rule shown in FIG. 3A, in accordance with some arrangements.

A method for setting the check node 300 to E is shown in FIG. 3B. At 312, the decoder 124, which may be control circuitry such as a processor, receives data from the variable nodes 302-308, which are stored in hard decision memory. At 314, the decoder 124 determines whether the number of variable nodes 302-308 with a value of "erased" is at least a threshold number of erased variable nodes. At 316, upon a determination that the number of variable nodes 302-308 with a value of "erased" (two in this case) is at least the threshold (two in this case), the decoder 124 stores an indication of "E" for the check node 300 in the syndrome memory. Rules applied when the number of "erased" variable nodes is less than the threshold are described in relation to FIGS. 3C through 3F. Similar methods can be used for applying these rules.

Figure 3C:
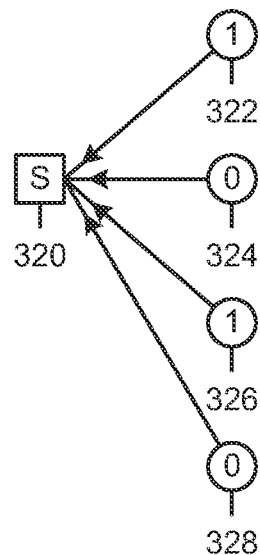
FIGS. 3C through 3F show graphical illustrations of additional processing rules for determining conditions of check nodes based on messages received from variable nodes, in accordance with some arrangements.

In FIG. 3C, the decoder 124 is determining a condition of a check node 320. The decoder 124 (acting on behalf of the check node 320) receives values of 1, 0, 1, and 0 from variable nodes 322, 324, 326, and 328, respectively. The decoder 124 processes the received values according to processing rules to determine whether a test for the check node 320 is satisfied. For example, the test may be to XOR all of the received values. In this case, $1 \oplus 0 \oplus 1 \oplus 0 = 0$, so the test is satisfied. Thus, the check node 320 is assigned a value of "S" (indicating a condition of "Satisfied"), as shown in FIG. 3C.

Figure 3D:
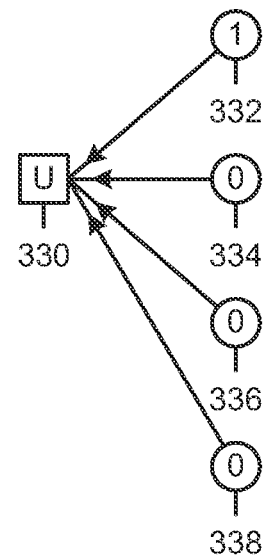

In FIG. 3D, the decoder 124 is determining a condition of a check node 330. The decoder 124 (acting on behalf of the check node 330) receives values of 1, 0, 0, and 0 from variable nodes 332, 334, 336, and 338, respectively. The decoder 124 processes the received values according to processing rules to determine whether a test for the check node 330 is satisfied. For example, the test may be to XOR all of the received values. In this case, $1 \oplus 0 \oplus 0 \oplus 0 = 1$, so the test is unsatisfied. Thus, the check node 330 is assigned a value of "U" (indicating a condition of "Unsatisfied"), as shown in FIG. 3D.

Figure 3E:
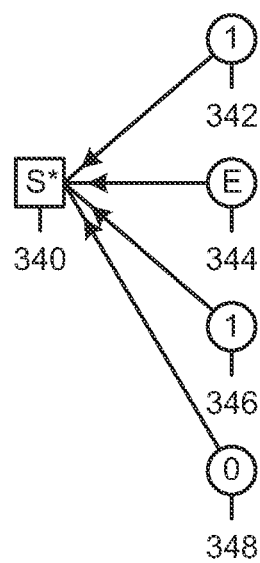

In FIG. 3E, the decoder 124 is determining a condition of a check node 340. The decoder 124 (acting on behalf of the check node 340) receives values 1, E, 1, and 0 from variable nodes 342, 344, 346, and 348, respectively. In this case, the threshold number of erased variable nodes that trigger an indication of "E" is two. So, in this case, the decoder 124 determines that, having received only one "erased" value, it does have enough information to determine whether a test for the check node 340 is satisfied. Thus, the decoder 124 processes the non-erased received values according to processing rules to determine whether a test for the check node 340 is satisfied, for example, by XORing all of the non-erased received values. In this case, $1 \oplus 1 \oplus 0 = 0$, so the test is satisfied. Ignoring the erased value implicitly assumes that the erased value is zero: $1 \oplus 0 \oplus 1 \oplus 0 = 0$. In assigning a value to the check node, the decoder 124 notes that one of the variable nodes 342, 344, 346, or 348 was erased. Thus, the check node 340 is assigned a value of "S*" (indicating a condition of "Satisfied with Erasure"), as shown in FIG. 3E.

Figure 3F:
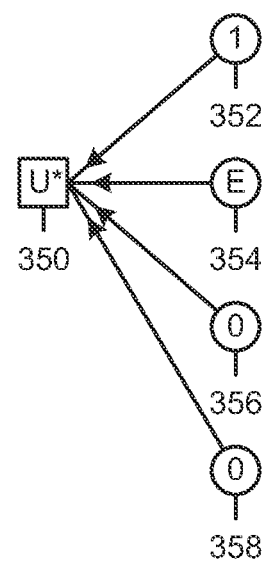

Similarly, in FIG. 3F, the decoder 124, which is determining a condition of a check node 350, receives a single "erased" value and three non-erased values. Again, the threshold number of erased variable nodes that trigger an indication of "E" is two. However, in this case, unlike in FIG. 3D, the three non-erased values (1, 0, and 0) do not satisfy the test of XORing the non-erased values ($1 \oplus 0 \oplus 0 = 1$). Again, ignoring the erased value implicitly assumes that the erased value is zero: $1 \oplus 0 \oplus 0 \oplus 0 = 1$. The check node 350 is assigned a value of "U*" (indicating a condition of "Unsatisfied with Erasure"), as shown in FIG. 3F.

In some arrangements, the Satisfied and Satisfied with Erasure conditions (S and S*) are merged, and both are stored as Satisfied (S). This reduces the number of possible indications to four, which simplifies the hardware and consumes less syndrome memory.

All of the rules described in relation to FIGS. 3A through 3F apply to check nodes that receive variable node values from four variable nodes. In other arrangements, the check node indications can be based on more or fewer variable nodes, and the processing rules can be adjusted accordingly. For example, in some arrangements, the threshold number of erased variable nodes that trigger an indication of "E" is always two, regardless of how many variable nodes each check node receives values from. In other arrangements, the threshold number of erased variable nodes that trigger an indication of "E" is greater than two. In yet other arrangements, the threshold number of erased variable nodes that trigger an indication of "E" is one, and the U* and S* states are not used.

FIGS. 4A through 4C show graphical illustrations of processing rules for determining a value of a variable node based on indications received from check nodes, in accordance with some arrangements. In FIGS. 4A through 4C, the value of the variable node being considered is E ("erased"), and the rules illustrated in FIGS. 4A through 4C dictate when and how variable nodes are assigned binary values, writing over their initial erased states. For FIGS. 4A, 4B, and 4C, the threshold number of matching non-E indications from check nodes needed to assign the variable node to a non-erased state is two.

In FIG. 4A, the decoder 124 (acting on behalf of the variable node 406) receives check node indications of E, S*, and E from variable nodes 400, 402, and 404, respectively. The decoder 124 processes the received values according to processing rules to determine whether the variable node 406 can be assigned to a binary state. In this case, the threshold number of check nodes to assign (two) has not been reached, so the variable node 406 is again assigned the erased state, E.

In FIG. 4B, the decoder 124 (acting on behalf of the variable node 416) receives check node indications of S*, S*, and E from variable nodes 410, 412, and 414, respectively. In arrangements where S and S* are merged, rather than originally indicating S*, the check nodes 410 and 412 would indicate S. The decoder 124 processes the received values according to processing rules to determine whether the variable node 416 can be assigned to a binary state. In this case, since two of the check nodes indicate that they are Satisfied with Erasure, the threshold number of matching non-E check nodes to assign (2) has been reached. So, the variable node 416 is assigned a value of 0. As described in relation to FIG. 3E, a check node indicating Satisfied with Erasure (S*) assumes that the value of the erased variable node is 0. Now that the erased variable node is assigned a 0, on the next check iteration, the condition of the check nodes 410 and 412 will become Satisfied (S).

In FIG. 4C, the decoder 124 (acting on behalf of the variable node 426) receives check node indications of U*, U*, and E from variable nodes 420, 422, and 424, respectively. The decoder 124 processes the received values according to processing rules to determine whether the variable node 426 can be assigned to a binary state. In this case, since two of the check nodes indicate that they are Unsatisfied with Erasure, the threshold number of matching non-E check nodes to assign (2) has been reached. So, the variable node 426 is assigned a value of 1. As described in relation to FIG. 3F, a check node indicating Unsatisfied with Erasure (U*) assumes that the value of the erased variable node is 0. With the erased variable node actually being assigned to 1, the XOR test will no longer be unsatisfied. So, on the next check iteration, the condition of the check nodes 420 and 422 will become Satisfied (S).

FIGS. 5A and 5B show graphical illustrations of processing rules for toggling the value of a variable node based on indications received from check nodes, in accordance with some arrangements. In FIGS. 5A and 5B, the value of the variable node being considered is a binary value (0 or 1), and the processing rules illustrated in FIGS. 5A and 5B dictate when a binary of a variable node is toggled or flipped to the other binary value. For FIGS. 5A and 5B, the threshold number of unsatisfied indications from check nodes needed to toggle the variable node is two.

In FIG. 5A, the decoder 124 (acting on behalf of the variable node 506) receives two check node indications of U from check nodes 502 and 504, and any non-U indication (E, S, S*, or U) from check node 500. The decoder 124 processes the received values according to processing rules to determine whether the variable node 506 should be toggled or flipped from 1 to 0. In this case, the threshold number of unsatisfied (U) check nodes to toggle (2) has been reached, so the variable node 506 is toggled to 0. Similarly, in FIG. 5B, the same check node indications are received (i.e., two unsatisfied indications), but the variable node 516 was originally set to 0. In this case, the value of the variable node 516 is toggled to 1.

For toggling or flipping variable nodes from one binary value to the other, the decoder 124 distinguishes between Unsatisfied (U) and Unsatisfied with Erasure (U*). So, if a variable node receives a single indication of U and one or even two indications of U*, the variable node is not toggled.

In some arrangements, the threshold to assign, the threshold to toggle, or both thresholds may vary between iterations of the decoding process. In some arrangements, the threshold to assign or the threshold to toggle is based on a probability of a particular binary value or another factor specific to a variable node.

The processing rules described in relation to FIGS. 4A, 4B, 4C, 5A, and 5B applied to variable nodes that receive indications from three check nodes. In other arrangements, the variable nodes receive indications from more or fewer check nodes. The thresholds can be adjusted according to the number of check nodes from which indications are received.

Figure 6:
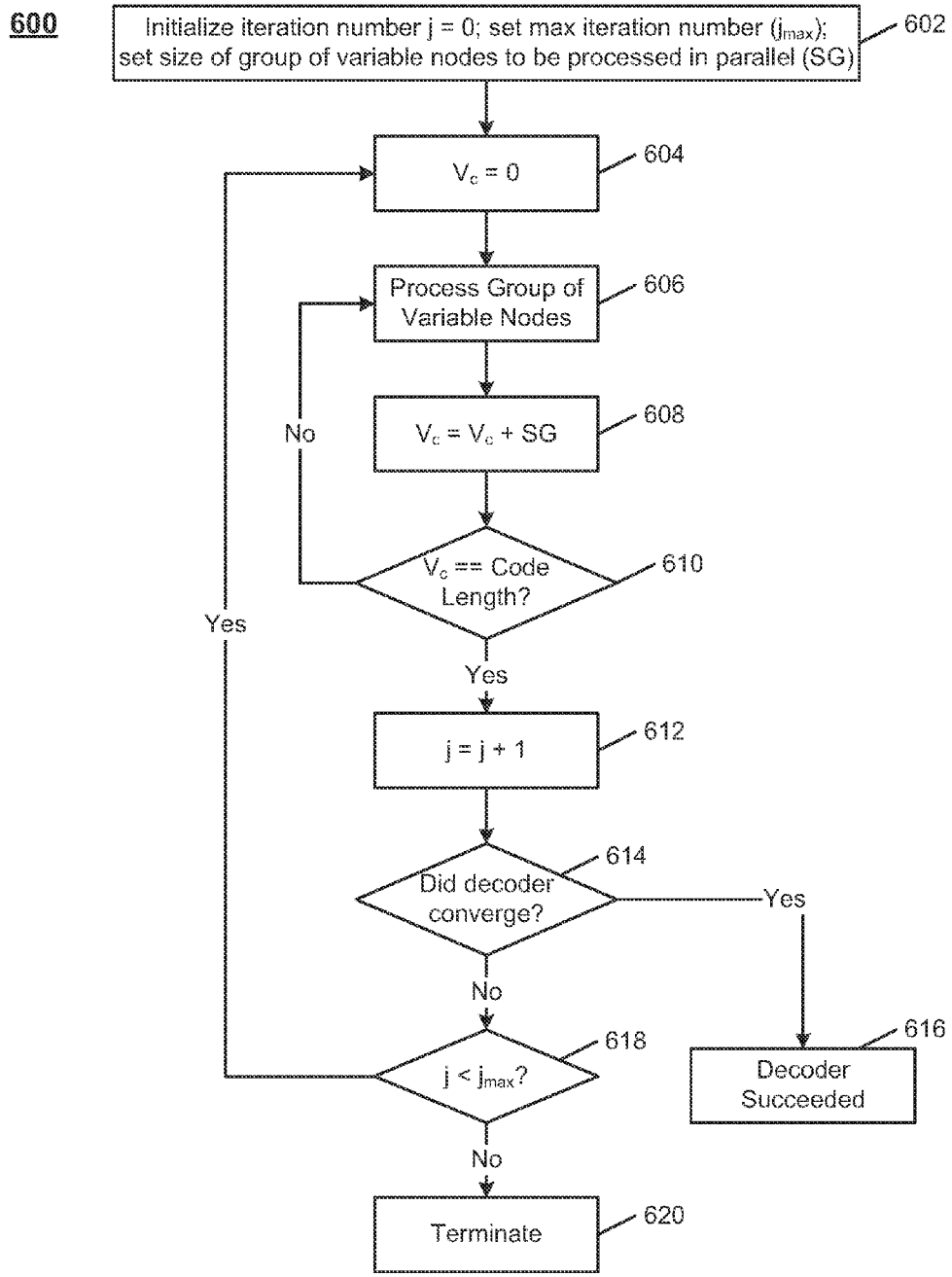
FIG. 6 shows a flow chart for a method of decoding a codeword with three-state input according to some arrangements.

FIG. 6 shows a flow chart for a method 600 of decoding a codeword with three-state input according to some arrangements. At 602, the decoder 124 initializes the decoding process. The initialization involves initializing the iteration number j to 0 and setting the maximum number of iterations ($j_{max}$). The maximum iterations $j_{max}$ is the most number of iterations of updating the variable node values and setting the check node indications that can be performed before the decoding process is automatically ended, even if the decoder did not determine the codeword. Variable nodes are processed in a certain order (e.g., natural order), but multiple variable nodes can be processed in parallel to increase decoding speed. So, at initialization, the decoder 124 also sets a group size of variable nodes to be processed in parallel (SG).

At 604, the decoder 124 initializes a loop counter $V_c$ for keeping track of the number of variable nodes that have been processed and sets $V_c$ to zero. At 606, the decoder 124 processes a group of variable nodes of size SG in parallel. For each variable node, the processing involves polling certain check nodes to determine if the value of the variable node should be updated, and updating the check node indications based on updates to the variable nodes. The processing is described in further detail in relation to FIG. 7.

At 608, after the group of variable nodes has been processed, the decoder 124 adds the number of variable nodes in the group that was just processed (SG) to the loop counter $V_c$. At 610, the decoder 124 determines whether $V_c$ equals the length of the codeword. If $V_c$ does not equal the length of the codeword, the method loops back to 606, at which the next group of variable nodes is processed. If $V_c$ equals the length of the codeword, at 612, the decoder 124 increments the iteration number j by one.

At 614, the decoder 124 determines whether or not the decoder 124 has converged. This means that the decoder 124 has assigned a binary value to all variable nodes and that the conditions of all of the check nodes are satisfied. In some arrangements, conditions for convergence are relaxed, and a minimum amount of error (e.g., a minimum amount of erased variable nodes or a minimum amount of unsatisfied check nodes) is permitted.

If the decoder converged, at 616, it is determined that the decoder succeeded. The decoder 124 then outputs the decoded message 128 to the receiving user or application 130.

At 618, if the decoder 124 did not converge, the decoder 124 determines whether the iteration number j is less than the maximum number of iterations $j_{max}$. If the iteration number j is less than the maximum number of iterations $j_{max}$, the method loops back to 604, where the loop counter $V_c$ is reset to zero and the variable nodes are processed again. If the iteration number j is not less than the maximum number of iterations $j_{max}$, at 620, the method terminates. In some arrangements, after terminating, the decoder 124 outputs the result of the decoding to the receiving user or application 130. In some arrangements, the decoder 124 or the receiving user or application 130 requests that the transmitting user or application 102 retransmit the codeword 110. The decision of whether to accept the message or request the message be resent may be based on the degree to which the decoder 124 determines that the decoded message 128 is incorrect.

Figure 7:
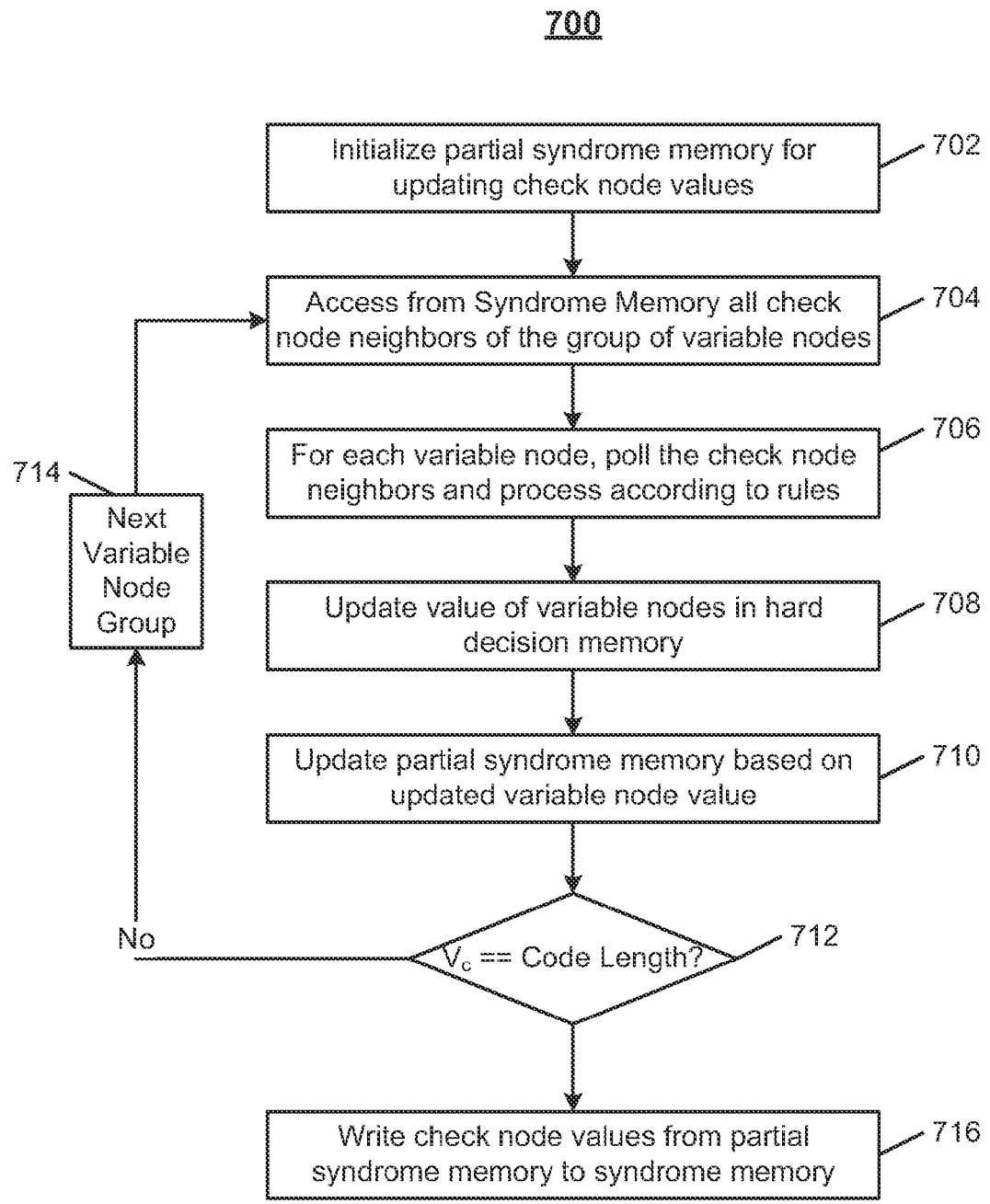
FIG. 7 shows a flow chart for a method of processing variable nodes in accordance with some arrangements.

FIG. 7 shows a flow chart for a method of processing variable nodes in accordance with some arrangements. This method is used in 606 of FIG. 6. At 702, the decoder 124 initializes a partial syndrome memory in which the check node values are updated. As the decoder 124 updates the variable nodes, it accesses the syndrome memory from the previous iteration and creates an updated version of the check nodes in the partial syndrome memory, as will be described further below. At 704, for a particular group of variable nodes, the decoder 124 accesses from syndrome memory the check node neighbors for the group of variable nodes. So, for example, if a group consists of three variable nodes, each of which is checked by four check nodes, the decoder will access twelve check nodes. In some arrangements, two or three of the variable nodes are checked by the same check node; in this case, that check node only has to be accessed one time, and fewer than twelve check nodes are accessed.

At 706, for each variable node in the group of variable nodes, the decoder 124 polls the check nodes that check that variable node. The indications of the check nodes are processed according to the processing rules described in relation to FIGS. 4A through 5B. At 708, based on the processing of the check node indications, the decoder 124 updates the value of the variable nodes in the hard decision memory. In 706 and 708, the variable nodes in the group of variable nodes may be processed in parallel or in series. At 710, based on the updated variable node values, the decoder 124 updates the partial syndrome memory based on the updated variable node values. For example, if a particular check node checks one of the variable nodes in the group, the new value of the variable node (which may be the same as the previous value) is XORed with the present value of the check node in the partial syndrome memory. In addition, the partial syndrome memory may have a counter for "erased" variable nodes; once this counter reaches the threshold of erased variable nodes, the check node in partial syndrome memory is set to E.

At 712, which is the same as 610, the decoder 124 determines whether $V_c$ equals the length of the codeword. If $V_c$ does not equal the length of the codeword, the method loops back to 704, which is the first element of 606 from FIG. 6, and the next group of variable nodes is processed. If $V_c$ equals the length of the codeword, at 716, the decoder 124 writes the check node values from the partial syndrome memory to the syndrome memory, thus overwriting the previous check node values stored in the syndrome memory. In FIG. 6, after 716 has been completed, the method continues to 612.

The above described arrangements and embodiments are presented for the purposes of illustration and not of limitation. One or more parts of techniques described above may be performed in a different order (or concurrently) and still achieve desirable results. In addition, the techniques of the disclosure may be implemented in hardware, such as on an application specific integrated circuit (ASIC) or on a field-programmable gate array (FPGA). The techniques of the disclosure may also be implemented in software, or in a combination of hardware and software.

What is claimed is:

1. A method for decoding data, the method comprising:
    receiving, at circuitry associated with a check node and a plurality of variable nodes, data from each of the plurality of variable nodes, wherein each variable node stores one of at least three values including a value indicative of an erased state, and each variable node corresponds to a bit of data being decoded;
    processing, by the circuitry, the values received from the plurality of variable nodes according to a set of processing rules for determining a condition related to the values stored by the plurality of variable nodes; and
    storing, by the circuitry, an indication of the determined condition at the check node.

2. The method of claim 1, wherein the data received from each of the plurality of variable nodes indicates whether a respective one of the variable nodes stores the value indicative of an erased state.

3. The method of claim 2, further comprising comparing each bit of the data being decoded to a first predetermined threshold and a second predetermined threshold, and, in response to determining that one of the bits of data is between the first predetermined threshold and the second predetermined threshold, storing the value indicative of an erased state in one of the plurality of variable nodes corresponding to the bit of data.

4. The method of claim 2, wherein the processing rules comprise a rule for determining whether a number of the values received from the plurality of variable nodes that are indicative of an erased state exceeds a third predetermined threshold, and providing the result of the determination as the condition.

5. The method of claim 2, wherein the processing rules comprise a rule for determining whether the values stored by the variable nodes that do not store the value indicative of an erased state satisfy a test of the variable nodes, and providing the result of the determination as the condition.

6. The method of claim 5, further comprising, for one of the variable nodes that does not store the value indicative of an erased state:
    receiving, at the circuitry, from each of a plurality of check nodes, a stored indication of a determined condition;
    determining, by the circuitry, whether a number of the stored indications of determined conditions that indicate that the test is unsatisfied exceeds a fourth predetermined threshold; and
    in response to determining that the number of indications that the test is unsatisfied exceeds the fourth predetermined threshold number, toggling the value stored by the one of the variable nodes.

7. The method of claim 5, wherein the value indicative of an erased state is a first value, the method further comprising, for one of the variable nodes that stores the first value:
    receiving, at the circuitry, from each of the plurality of check nodes, a stored indication of a determined condition;
    in response to determining, by the circuitry, that a number of the stored indications that indicate that the test is satisfied exceeds a fifth predetermined threshold number, storing a second value in the variable node; and
    in response to determining, by the circuitry, that a number of the stored indications that indicate that the test is unsatisfied exceeds a sixth predetermined threshold number, storing a third value in the variable node.

8. The method of claim 5, wherein, in response to determining that the number of values indicative of the erased state is greater than or equal to one and less than or equal to the third threshold, the determined condition is either a condition that the test is satisfied and at least one variable node indicates an erased state, or a condition that the test is unsatisfied and at least one variable node indicates an erased state.

9. The method of claim 1, further comprising combining the stored indications of the determined conditions in one or more blocks of memory, wherein the number of check nodes is greater than the number of blocks of memory.

10. The method of claim 1, further comprising combining the values of the plurality of variable nodes in one or more blocks of memory, wherein the number of variable nodes is greater than the number of blocks of memory.

11. A controller for decoding data, the controller comprising processing circuitry associated with a check node and a plurality of variable nodes, and the processing circuitry configured to:
    receive data from each of the plurality of variable nodes, wherein each variable node stores one of at least three values including a value indicative of an erased state, and each variable node corresponds to a bit of data being decoded;
    process the values received from the plurality of variable nodes according to a set of processing rules for determining a condition related to the values stored by the plurality of variable nodes; and store an indication of the determined condition at the check node.

12. The controller of claim 11, wherein the data received from each of the plurality of variable nodes indicates whether a respective one of the variable nodes stores the value indicative of an erased state.

13. The controller of claim 12, wherein the processing circuitry is further configured to:

compare each bit of the data being decoded to a first predetermined threshold and a second predetermined threshold; and in response to determining that one of the bits of data is between the first predetermined threshold and the second predetermined threshold, store the value indicative of an erased state in one of the plurality of variable nodes corresponding to the bit of data.

14. The controller of claim 12, wherein the processing rules comprise a rule for determining whether a number of the values received from the plurality of variable nodes that are indicative of an erased state exceeds a third predetermined threshold, and wherein the processing circuitry is further configured to provide the result of the determination as the condition.

15. The controller of claim 12, wherein the processing rules comprise a rule for determining whether the values stored by the variable nodes that do not store the value indicative of an erased state satisfy a test of the variable nodes, and wherein the processing circuitry is further configured to provide the result of the determination as the condition.

16. The controller of claim 15, wherein the processing circuitry is further configured to, for one of the variable nodes that does not store the value indicative of an erased state:

receive, from each of a plurality of check nodes, a stored indication of a determined condition;

determine whether a number of the stored indications of determined conditions that indicate that the test is unsatisfied exceeds a fourth predetermined threshold; and in response to determining that the number of indications that the test is unsatisfied exceeds the fourth predetermined threshold number, toggle the value stored by the one of the variable nodes.

17. The controller of claim 15, wherein the value indicative of an erased state is a first value, and wherein the processing circuitry is further configured to, for one of the variable nodes that stores the first value:

receive, from each of the plurality of check nodes, a stored indication of a determined condition; in response to determining that a number of the stored indications that indicate that the test is satisfied exceeds a fifth predetermined threshold number, store a second value in the variable node; and in response to determining that a number of the stored indications that indicate that the test is unsatisfied exceeds a sixth predetermined threshold number, store a third value in the variable node.

18. The controller of claim 15, wherein, in response to determining that the number of values indicative of the erased state is greater than or equal to one and less than or equal to the third threshold, the determined condition is either a condition that the test is satisfied and at least one variable node indicates an erased state, or a condition that the test is unsatisfied and at least one variable node indicates an erased state.

19. The controller of claim 11, wherein the processing circuitry is further configured to combine the stored indications of the determined conditions in one or more blocks of memory, wherein the number of check nodes is greater than the number of blocks of memory.

20. The controller of claim 11, wherein the processing circuitry is further configured to combine the values of the plurality of variable nodes in one or more blocks of memory, wherein the number of variable nodes is greater than the number of blocks of memory.

* * * * *